United States Patent
Koktzoglou et al.

(10) Patent No.: US 10,120,048 B2
(45) Date of Patent: Nov. 6, 2018

(54) SYSTEMS AND METHODS FOR EFFICIENT RADIAL MAGNETIC RESONANCE IMAGING WITH AZIMUTHAL EQUIDISTANT PROJECTIONS

(71) Applicant: Northshore University HealthSystem, Evanston, IL (US)

(72) Inventors: Ioannis Koktzoglou, Des Plaines, IL (US); Shivraman Giri, Chicago, IL (US); Robert R. Edelman, Highland Park, IL (US)

(73) Assignee: NORTHSHORE UNIVERSITY HEALTHSYSTEM, Evanston, IL (US)

( * ) Notice: Subject to any disclaimer, the term of this patent is extended or adjusted under 35 U.S.C. 154(b) by 553 days.

(21) Appl. No.: 14/788,266

(22) Filed: Jun. 30, 2015

(65) Prior Publication Data
US 2016/0025829 A1    Jan. 28, 2016

Related U.S. Application Data

(60) Provisional application No. 62/029,643, filed on Jul. 28, 2014.

(51) Int. Cl.
  *G01R 33/48*    (2006.01)
  *G01R 33/565*   (2006.01)

(52) U.S. Cl.
  CPC .... *G01R 33/4824* (2013.01); *G01R 33/56518* (2013.01)

(58) Field of Classification Search
  None
  See application file for complete search history.

(56) References Cited

U.S. PATENT DOCUMENTS

| | | | | |
|---|---|---|---|---|
| 7,622,926 B2 * | 11/2009 | Taniguchi | ........ | G01R 33/4824 324/309 |
| 8,306,299 B2 * | 11/2012 | Samsonov | ....... | G01R 33/56509 382/128 |
| 2005/0073303 A1 * | 4/2005 | Harer | ................ | G01R 33/4824 324/307 |

OTHER PUBLICATIONS

Wundrak, et al., A Small Surrogate for the Golden Angle in Time-Resolved Radial MRI Based on Generalized Fibonacci Sequences, IEEE Transactions on Medical Imaging, vol. 34, No. 6, Jun. 2015.
Cashen et al., 4D Radial Contrast-Enhanced MR Angiography with Sliding Subtraction, Magn Reson Med. Nov. 2007 ; 58(5): 962-972.
Winklemann et al., An Optimal Radial Profile Order Based on the Golden Ratio for Time-Resolved MRI, IEEE Transactions on Medical Imaging, vol. 26, No. 1, Jan. 2007.

* cited by examiner

*Primary Examiner* — Dixomara Vargas
*Assistant Examiner* — Douglas X Rodriguez
(74) *Attorney, Agent, or Firm* — Quarles & Brady LLP

(57) ABSTRACT

Systems and methods for designing a data acquisition scheme to be used in magnetic resonance imaging ("MRI") are provided. In particular, the systems and methods include designing efficient, or otherwise optimized, azimuthal equidistant projections for radially sampling k-space. This sampling pattern resulting from this data acquisition scheme minimizes image artifacts, including those attributable to eddy currents. The data acquisition scheme can be computed rapidly and automatically and, thus, is fit for routine use in clinical MRI systems.

15 Claims, 4 Drawing Sheets

SYSTEMS AND METHODS FOR EFFICIENT RADIAL MAGNETIC RESONANCE IMAGING WITH AZIMUTHAL EQUIDISTANT PROJECTIONS

CROSS-REFERENCE TO RELATED APPLICATIONS

This application is based on, claims priority to, and incorporates herein by reference in its entirety, U.S. Provisional Patent Application Ser. No. 62/029,643, filed, Jul. 28, 2014, and entitled, "SYSTEMS AND METHODS FOR EFFICIENT RADIAL MAGNETIC RESONANCE IMAGING WITH AZIMUTHAL EQUIDISTANT PROJECTIONS."

STATEMENT REGARDING FEDERALLY SPONSORED RESEARCH

N/A

BACKGROUND

The present disclosure relates to systems and methods for magnetic resonance imaging ("MRI"). More particularly, disclosure relates to systems and methods for designing and implementing data acquisition schemes for MRI that sample k-space along a series of azimuthal equidistant projections.

Radial MRI permits the use of higher undersampling factors and is more tolerant to physiologic motion artifacts than Cartesian MRI. The traditional method of sampling radial k-space involves acquiring projections that are evenly spaced in the azimuthal direction. For instance, radial acquisitions can include acquiring a projection every 180/N degrees, where N is the number of projections in the acquisition.

Although the conventional radial MRI approach provides satisfactory image quality in many circumstances, it can lead to artifacts from physiologic motion, including arterial pulsation, respiration, or other spurious motion. Artifacts can also arise from evolving spin magnetization because the projections that are degraded by motion are closely clustered together in k-space and materially degrade image quality.

Methods to randomly or pseudorandomly sample radial k-space and suppress these image artifacts result in artifacts related to eddy currents. To minimize such artifacts, the radial trajectory utilized should distribute projections around the azimuthal space in a substantially uniform manner, while simultaneously providing for evenly spaced projections using a constant, relatively small azimuthal distance between the acquisition of successive projections.

An optimal solution to this radial projection ordering problem is not easily obtainable and requires the use of significant computational effort that is time consuming and ill-suited for applications in the clinical setting. There thus remains a need to provide a method for efficiently computing the azimuthal angular increments that provide for azimuthal substantially equidistant projections.

Other methods for providing substantially uniform radial k-space sampling while distributing successive projections over the radial k-space domain have been proposed. One such method involves the use of a golden angle azimuthal projection increment of around 111.25 degrees. Although the use of a golden azimuthal angle increment generally provides widespread sampling of k-space, the method does not provide substantially equidistant projections in radial k-space and leaves gaps of k-space un-sampled, which results in image artifacts. Furthermore, the use of a large golden azimuthal angle increment of around 111.25 degrees also requires large changes in the imaging gradients from projection to projection, which results in eddy currents that degrade image quality.

Another method involves the use of a trajectory that "pseudorandomly" samples radial k-space. This approach, however, does not ensure the acquisition of azimuthal substantially equidistant projections. In particular, this method requires the user to judiciously pre-select five parameters for use in a lengthy analytical expression. At present, there is no known method for properly selecting these five parameters for a given radial scan. Improper parameter selection results in the acquisition of overlapping (i.e., duplicated) projections and the exacerbation of artifacts from radial undersampling.

It would therefore be desirable to provide systems and methods that are capable of designing and implementing radial k-space acquisitions using azimuthal substantially equidistant projections.

SUMMARY

The systems and methods of the present disclosure overcome the aforementioned drawbacks by producing an image of a subject using a magnetic resonance imaging ("MRI") system, in which data is acquired from a subject by directing the MRI system to perform a pulse sequence that samples k-space along a series of projections, wherein successive projections in the series of projections are spaced apart by an azimuthal increment angle that is computed to substantially uniformly distribute the series of projections across k-space while minimizing image artifacts, including artifacts associated with eddy currents generated by magnetic field gradients and streak artifacts. At least one image of the subject is then reconstructed from the acquired k-space data.

In accordance with another aspect of the disclosure, a magnetic resonance imaging (MRI) system is disclosed that includes a magnet system configured to generate a static magnetic field about at least a portion of a subject arranged in the MRI system, a gradient system configured to establish at least one magnetic gradient field with respect to the static magnetic field, and a radio frequency (RF) system configured to deliver excitation pulses to the subject and acquire imaging data from the subject. The MRI system also includes a computer system programmed to acquire the data from the subject by directing the gradient system and the RF system to perform a pulse sequence that samples k-space along a series of projections. Successive projections in the series of projections are spaced apart by an azimuthal increment angle that is computed to substantially uniformly distribute the series of projections across k-space while minimizing image artifacts. The computer system is further programmed to reconstruct at least one image of the subject from the acquired k-space data.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Described here are systems and methods for designing a data acquisition scheme to be used in magnetic resonance imaging ("MRI"). In particular, the systems and methods include designing efficient, or otherwise optimized, azimuthal equidistant projections for radial MRI. This data acquisition scheme includes acquiring k-space data by sampling radial k-space along azimuthal substantially equidistant projections while minimizing image artifacts. The data acquisition scheme can be computed rapidly and automatically and, thus, is fit for routine use in clinical MRI systems.

The systems and methods include computing view angle increments that define a k-space sampling pattern, where the view angle increments are computed to ensure uniform azimuthal coverage for the particular number of views. Having a uniform distribution of views reduces artifacts and helps to ensure that the minority of views that show artifactual signal fluctuations is optimally distributed over k-space, rather than occurring in bunches that might cause more artifacts in the reconstructed image.

Figure 1:
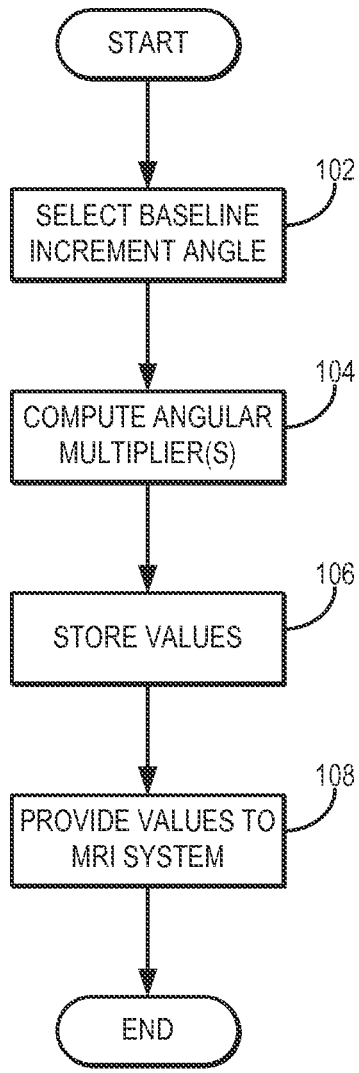
FIG. 1 is a flowchart setting forth the steps of an example method for designing azimuthal substantially equidistant projections for radially sampling k-space.

Referring now to FIG. 1, a flowchart is illustrated as setting forth the steps of an example method for designing azimuthal substantially equidistant projections for radially sampling k-space. The method includes computing a baseline azimuthal angular increment angle, $\theta_B$, as indicated at step 102. As an example, the baseline azimuthal increment angle, $\theta_B$, can be computed as, $$\theta_B = \frac{180}{N}; \qquad (1)$$

where N is the number of radial projections to be used in the acquisition.

One or more azimuthal angular multipliers, m, that scale the azimuthal increment angle, $\theta_B$, are then determined, as indicated at step 104. The one or more angular multipliers provide a constant azimuthal increment of $m \times \theta_B$ degrees between successively acquired projections and yields azimuthal substantially equidistant projections to sample radial k-space. In general, the values for m are preferably sufficiently small so that eddy current-related artifacts are significantly reduced and artifactual projections are substantially evenly distributed in radial k-space. The values of m may be intelligently chosen by approximating a target azimuthal angular increment that is preselected by the user, or that is fixed for a given pulse sequence or MRI system.

In one aspect of the disclosure, the one or more angular multipliers, m, can be obtained from the set of integers ranging from 2 to N−1, where m does not share the mathematical integer factor, j, in common with N, and where j>1.

In another aspect of the disclosure, the one or more angular multipliers, m, can be determined by performing numerical simulations over a range of integer and fractional values of m to ensure that projections are substantially equidistant and non-overlapping. Values of m providing azimuthal substantially equidistant and non-overlapping projections may then be selected. Numerical optimization techniques (e.g., Nelder-Mead, simulated annealing) may be used to more rapidly identify values of m that provide for substantially equidistant and non-overlapping projections.

The angular multipliers, m, and the corresponding azimuthal angular increments, $\theta_B$, are then stored for later use, as indicated at step 106. In some configurations, this storage is only temporary as the angular multipliers, m, and the corresponding azimuthal angular increments, $\theta_B$, may be calculated on the fly at the time the pulse sequence is executed. In other configurations, the angular multipliers, m, and the corresponding azimuthal angular increments, $\theta_B$, are pre-computed and stored for later use in a data matrix, look-up table, or the like.

The stored angular multipliers, m, and the corresponding azimuthal angular increments, $\theta_B$, are then provided to an MRI system, as indicated at step 108. The MRI system uses the values to prescribe a pulse sequence that results in k-space being sampled according to the angular multipliers, m, and the corresponding azimuthal angular increments, $\theta_B$. The data acquisition is compatible with two-dimensional and three-dimensional radial acquisitions, including "stack of stars" radial acquisitions.

Unlike previous methods, the present innovation provides systems and methods for ensuring the acquisition of azimuthally substantially equidistant projections, while providing a constant azimuthal angular increment between successively acquired projections. Examples of different radial sampling patterns are illustrated in FIGS. 2A-2D.

Figure 2A:
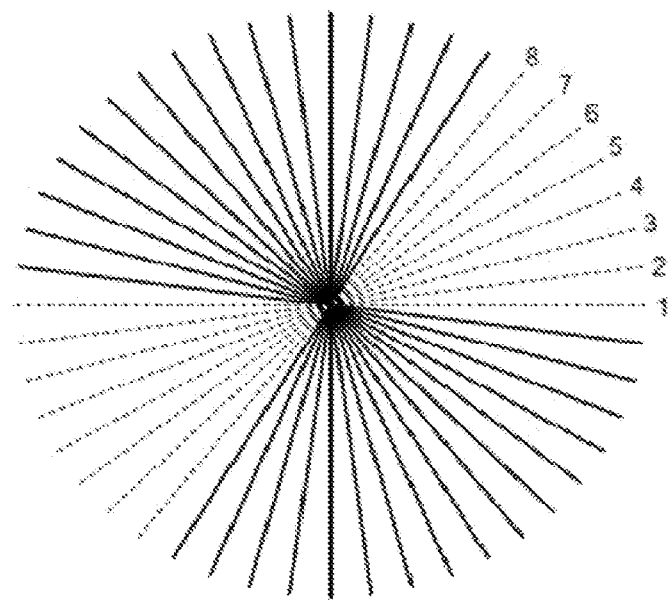
FIG. 2A is a schematic illustration showing a radial sampling pattern with a linear azimuthal increment angle determined using the methods of the present disclosure.

FIG. 2A illustrates an example of a sampling pattern using a conventional linear azimuthal view angle increment, in which the azimuthal angle of N successive projections is incremented by an incremental angle 180/N. This sampling pattern results in a subset of successive projections not uniformly sampling k-space, as shown by the eight dashed projections, which are bunched together.

Figure 2B:
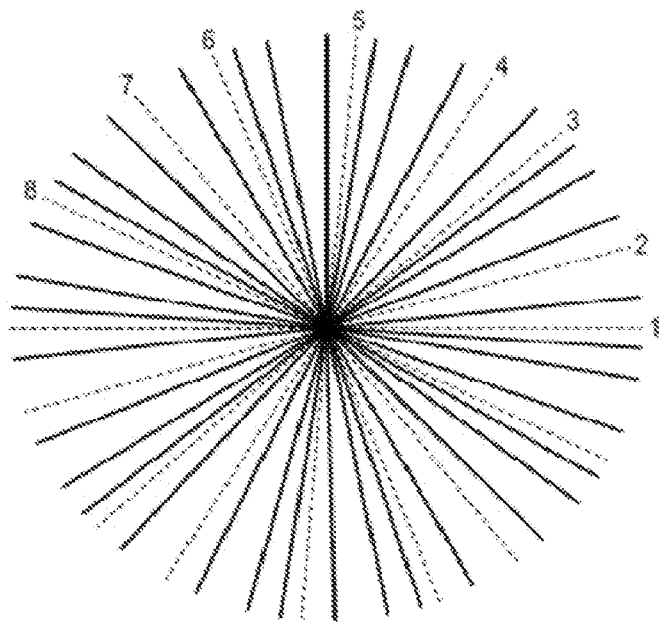
FIG. 2B is a schematic illustration showing a radial sampling pattern with a golden angle increment determined using the methods of the present disclosure.
Figure 2C:
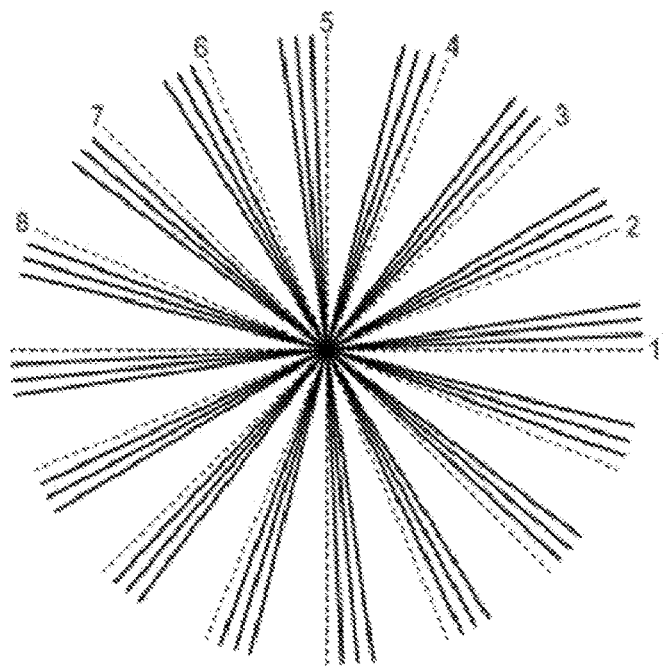
FIG. 2C is a schematic illustration showing a radial sampling pattern with a non-optimized angular increment.
Figure 2D:
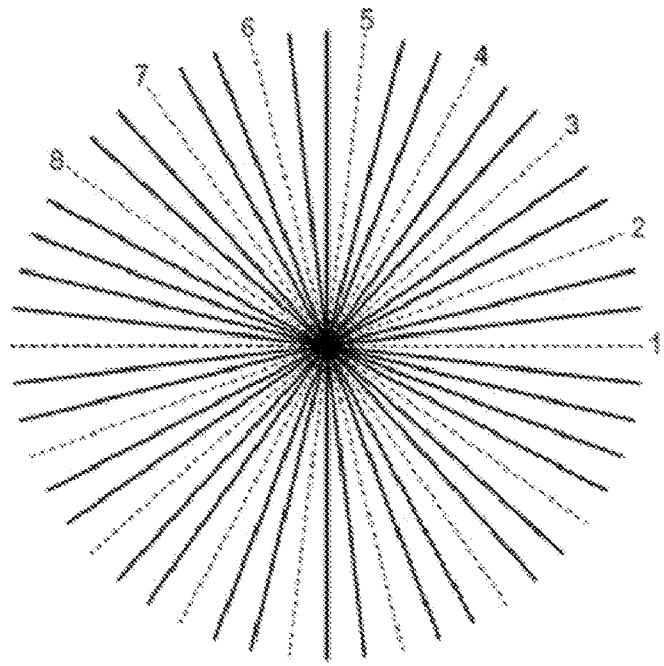
FIG. 2D is a schematic illustration showing a radial sampling pattern with an optimized angular increment with azimuthal equidistant projections determined using the methods of the present disclosure.

FIG. 2B illustrates an example of a sampling pattern using a golden angle increment. Although the golden angle increment provides more uniform k-space coverage for successively acquired projections than the linear angle increment in FIG. 2A, it can be seen that the golden angle increment suffers from non-uniform coverage of k-space as a whole. That is, the golden angle increment results in significant gaps in k-space coverage. FIG. 2C illustrates an example of a sampling pattern using a non-optimized view angle increment that suffers from many of the same problems as the golden angle increment. FIG. 2D illustrates an example of a sampling pattern achieved using the method described above.

Unlike the latter approaches, the method of the present disclosure provides uniform sampling of radial k-space with azimuthal substantially equidistant projections. By way of example, the desired target azimuthal angular increment from N=67 successively acquired projections can be selected as ten degrees. In this example, the view angle increment may be computed as around 10.7463 degrees. That is, the optimized angular multiplier, m, is m=4, such that, $$m \cdot \left(\frac{180}{N}\right) = 4 \cdot \left(\frac{180}{67}\right) = 10.7463. \quad (2)$$

This example provides uniform sampling of radial k-space with azimuthal substantially equidistant, non-overlapping projections. Conversely, with a pseudorandom method, setting the number of segments equal to two (i.e., providing an azimuthal angular jump size of around 10 degrees), nearly half of all the acquired projections overlap, and large gaps in radial k-space remain.

The systems and methods of the present disclosure can be used to provide a sampling strategy for various different applications of MRI. As one non-limiting example, the method can be implemented for magnetic resonance angiography ("MRA"), including non-contrast enhanced MRA methods. For instance, the radial sampling pattern with azimuthal equidistant projections obtained by the present disclosure can be used to allow diagnostic quality images of the peripheral arteries to be obtained without using ECG gating or a peripheral vascular coil. The use of the radial k-space trajectory with optimized azimuthal equidistant projections results in all of the acquired views being equally weighted in the reconstructed image. Flow-related signal fluctuations that occur in a minority of views are thus diluted by the intact signals from the remaining views, so that there is only a minor impact on image quality.

The radial sampling pattern provided by the present disclosure performed better than the golden angle increment approach. The golden angle increment results in large interview jumps in gradient amplitude, which produce eddy current-related image artifacts. These jumps are avoided using the smaller optimized view angle increment provided by the present disclosure.

Figure 3:
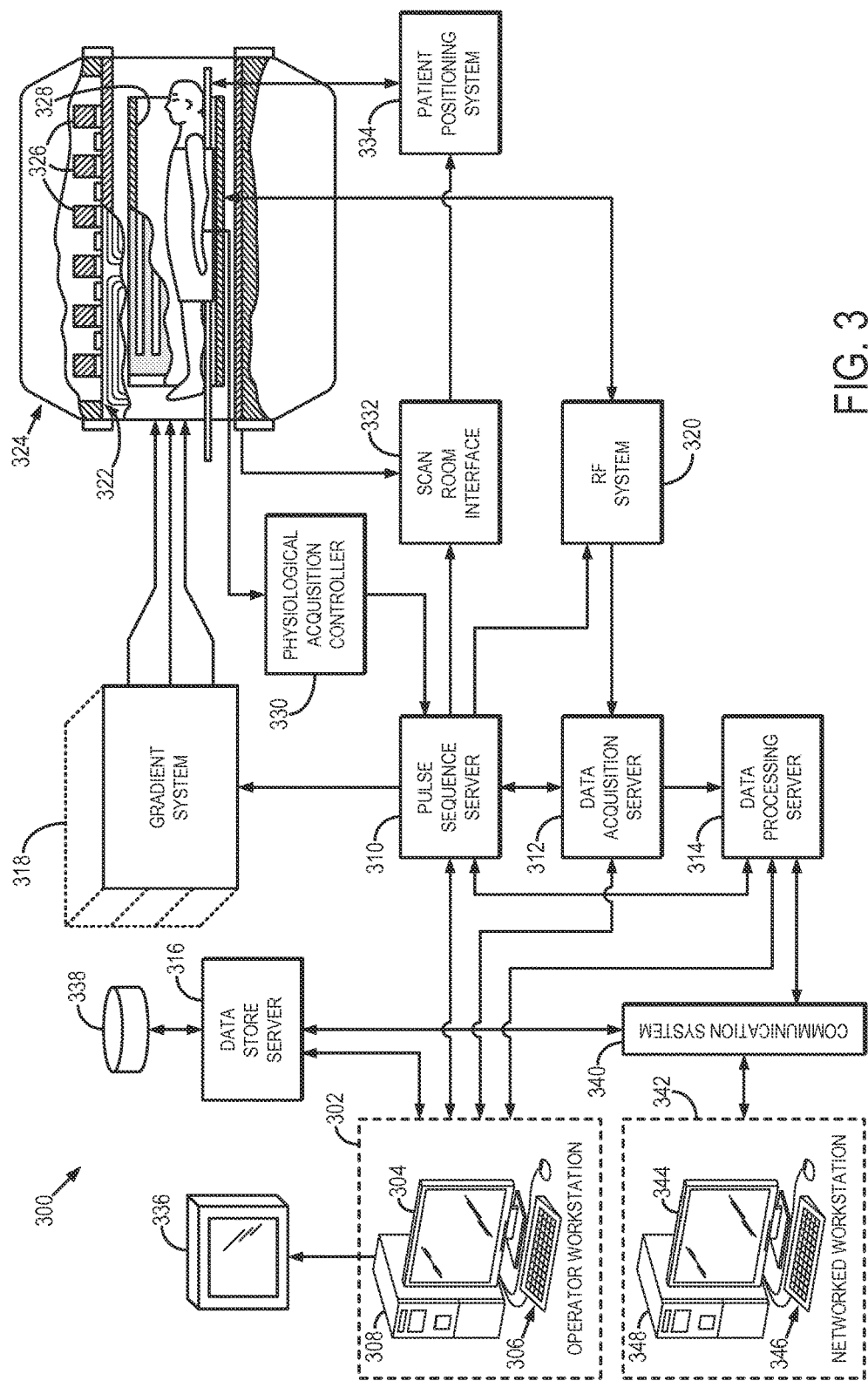
FIG. 3 is a block diagram of an example of a magnetic resonance imaging ("MRI") system configured for use in accordance with the present disclosure.

Referring particularly now to FIG. 3, an example of a magnetic resonance imaging ("MRI") system 300 is illustrated. The MRI system 300 includes an operator workstation 302, which will typically include a display 304; one or more input devices 306, such as a keyboard and mouse; and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to four servers: a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms necessary to perform the prescribed scan are produced and applied to the gradient system 318, which excites gradient coils in an assembly 322 to produce the magnetic field gradients $G_x$, $G_y$, and $G_z$ used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil (not shown in FIG. 3), are received by the RF system 320, where they are amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays (not shown in FIG. 3).

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \quad (3);$$

and the phase of the received magnetic resonance signal may also be determined according to the following relationship:

$$\varphi = \tan^{-1}\left(\frac{Q}{I}\right). \quad (4)$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 314 are conveyed back to the operator workstation 302 where they are stored. Real-time images are stored in a data base memory cache (not shown in FIG. 3), from which they may be output to operator display 312 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344; one or more input devices 346, such as a keyboard and mouse; and a processor 348. The networked workstation 342 may be located within the same facility as the operator workstation 302, or in a different facility, such as a different healthcare institution or clinic.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

What is claimed is:

1. A method for producing an image of a subject using a magnetic resonance imaging (MRI) system, the steps of the method comprising:
   (a) acquiring data from a subject by directing an MRI system to perform a pulse sequence that samples k-space along a series of projections, wherein successive projections in the series of projections that span in multiple cycles are spaced apart by an azimuthal increment angle and are computed to change in each cycle as a combination of a baseline increment angle and an angular multiplier to substantially uniformly distribute the series of projections in the multiple cycles across k-space while minimizing image artifacts;
   (b) reconstructing at least one image of the subject from the acquired k-space data; and
   wherein step (a) includes computing the azimuthal increment angle to minimize the image artifacts associated with eddy currents generated by magnetic field gradients.

2. The method as recited in claim 1, wherein step (a) includes computing the azimuthal increment angle to also minimize streak artifacts.

3. The method as recited in claim 1, wherein step (a) includes retrieving previously computed azimuthal increment angle values from a stored database of azimuthal increment angle values.

4. A method for producing an image of a subject using a magnetic resonance imaging (MRI) system, the steps of the method comprising:
   (a) acquiring data from a subject by directing an MRI system to perform a pulse sequence that samples k-space along a series of projections, wherein successive projections in the series of projections that span in multiple cycles are spaced apart by an azimuthal increment angle and are computed to change in each cycle as a combination of a baseline increment angle and an angular multiplier to substantially uniformly distribute the series of projections in the multiple cycles across k-space while minimizing image artifacts;
   (b) reconstructing at least one image of the subject from the acquired k-space data.

5. The method as recited in claim 4, wherein computing the angular multiplier includes computing the angular multiplier as an integer value ranging from 2 to N−1, wherein N is a number of projections in the series of projections.

6. The method as recited in claim 5, wherein the angular multiplier is computed as an integer that does not share an integer factor with N, wherein the integer factor is greater than one.

7. The method as recited in claim 4, wherein computing the angular multiplier includes performing numerical simulations over a range of integer and fractional values of the angular multiplier m to determine an angular multiplier that produces a series of projections that are substantially equidistant and non-overlapping.

8. A magnetic resonance imaging (MRI) system, comprising:
   a magnet system configured to generate a static magnetic field about at least a portion of a subject arranged in the MRI system;
   a gradient system configured to establish at least one magnetic gradient field with respect to the static magnetic field;
   a radio frequency (RF) system configured to deliver excitation pulses to the subject and acquire imaging data from the subject;

a computer system programmed to:
acquire the data from the subject by directing the gradient system and the RF system to perform a pulse sequence that samples k-space along a series of projections that span in multiple cycles, wherein successive projections in the series of projections that span in the multiple cycles are spaced apart by an azimuthal increment angle and are computed to change in each cycle as a combination of a baseline increment angle and an angular multiplier to substantially uniformly distribute the series of projections that span in the multiple cycles across k-space while minimizing image artifacts, wherein he azimuthal increment angle is computed as a combination of a baseline increment angle and an angular multiplier; and
reconstruct at least one image of the subject from the acquired k-space data.

9. The system as recited in claim 8, wherein the computer system is further programmed to compute the azimuthal increment angle to control image artifacts associated with eddy currents caused by magnetic fields generated by the gradient system.

10. The system as recited in claim 8, wherein the computer system is further programmed to compute the azimuthal increment angle to control streak artifacts.

11. The system as recited in claim 8, wherein the computer system is further programmed to compute the angular multiplier as an integer value ranging from 2 to N−1, wherein N is a number of projections in the series of projections.

12. The system as recited in claim 11, wherein the computer system is further programmed to compute the angular multiplier as an integer that does not share an integer factor with N, wherein the integer factor is greater than one.

13. The system as recited in claim 8, wherein the computer system is further programmed to perform numerical simulations over a range of integer and fractional values of the angular multiplier m to determine an angular multiplier that produces a series of projections that are substantially equidistant and non-overlapping.

14. The system as recited in claim 8, wherein the computer system is further programmed to retrieve previously-computed azimuthal increment angle values from a stored database of azimuthal increment angle values.

15. The system as recited in claim 8, further comprising a display configured to display the at least one image of the subject from the acquired k-space data.

* * * * *